US006297962B1

(12) United States Patent
Johnson et al.

(10) Patent No.: US 6,297,962 B1
(45) Date of Patent: Oct. 2, 2001

(54) APPARATUS FOR PROVIDING DISPLACEMENT TO A SLIDE MOUNTED CHASSIS IN A RACK

(75) Inventors: Chris Stephen Johnson; Alfred Rafi Baddour, both of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/489,409

(22) Filed: Jan. 21, 2000

(51) Int. Cl.$^7$ ........................................................ H05K 7/14
(52) U.S. Cl. ...................... 361/726; 361/724; 361/725; 361/732; 361/740; 361/747; 312/215; 312/222; 312/350; 248/535
(58) Field of Search ..................................... 361/726, 801, 361/802, 727, 732, 747, 798, 807, 825, 724, 725, 740; 312/215, 222, 350, 223.1, 223.2; 248/535, 536, 560

(56) References Cited

U.S. PATENT DOCUMENTS

| 4,931,907 | | 6/1990 | Robinson et al. ..................... 361/391 |
| 5,262,923 | * | 11/1993 | Batta et al. ........................... 361/685 |
| 5,332,306 | * | 7/1994 | Babb et al. ........................... 312/334.16 |
| 5,432,682 | * | 7/1995 | Giehl et al. ........................... 361/796 |
| 5,505,533 | | 4/1996 | Kammersqard et al. ............. 312/236 |
| 5,683,159 | * | 11/1997 | Johnson ............................... 312/334.7 |
| 5,785,401 | * | 7/1998 | Bowyer et al. ....................... 312/350 |
| 5,941,621 | * | 8/1999 | Boulay et al. ....................... 312/334.4 |
| 5,984,442 | * | 11/1999 | Hellman, Jr. ....................... 312/334.12 |
| 6,011,701 | | 1/2000 | Kopp et al. ........................... 361/818 |
| 6,141,209 | * | 10/2000 | Kerrigan et al. ....................... 361/683 |
| 6,181,549 | * | 1/2001 | Mills et al. ........................... 361/683 |
| 6,201,702 | * | 3/2001 | Schmitt ............................... 361/725 |
| 6,209,842 | * | 4/2001 | Anderson et al. ..................... 248/560 |

OTHER PUBLICATIONS

U.S. Pending patent application Ser. No. 09/181,289 entitled "Multi–Segmented, Nesting, Low Profile Cable Management Arm" by Beall, et al.; Dell USA, L.P., filed Oct. 28, 1998.

* cited by examiner

Primary Examiner—Leo P. Picard
Assistant Examiner—David Foster
(74) Attorney, Agent, or Firm—Baker Botts L.L.P.

(57) ABSTRACT

The present disclosure provides a computer mounted rack system and an apparatus enabling displacement of a slide mounted chassis. The apparatus includes an elongated member having respective first and second ends and respective first and second surfaces. A handle is also included and is preferably coupled proximate the first end of the elongated member. The apparatus further includes a releasable latch preferably coupled proximate the second end of the elongated member and configured to engage a releasable latch aperture in the slide. Additionally, at least one locking member is preferably coupled to the first surface of the elongated member and is operable to engage the slide.

17 Claims, 5 Drawing Sheets

APPARATUS FOR PROVIDING DISPLACEMENT TO A SLIDE MOUNTED CHASSIS IN A RACK

FIELD OF THE INVENTION

The present invention relates generally to rack mounted computer systems and, more particularly, to an apparatus which allows displacement of computer components attached to a slide mounted chassis in a rack.

BACKGROUND OF THE INVENTION

As various electronic components used to make computer systems and peripherals have gotten increasingly smaller, so have the chassis in which they are placed. The most significant size decreases have been seen in more powerful computer designs such as servers.

Servers are now produced such that their chassis will fit into what is known as a hardware storage system or rack. These racks are employed to store computer systems with greater amounts of computing power while requiring a relatively small footprint. As a result of placing this computing power into racks, many peripherals commonly used in conjunction with servers have also been made to fit into racks.

To increase the effectiveness of the migration to rack mounted computer systems, standardization of chassis size and rack size has been implemented. The capacity of racks is often measured in height by the number of 'U's, where each 'U' is generally equivalent to 1.75 inches. The standard internal height for "Tall" racks is typically 42U or 73.5 inches; "Short" racks are typically 24U or 42.0 inches in height. As computer and peripheral chassis are manufactured, their height dimensions are designed to occupy rack space in multiples of 'U', ranging upwards from 1U.

Each chassis in a rack is usually mounted onto a pair of slide assemblies allowing the components to be moved either forwards or backwards relative to the rack. Chassis displacement or movement relative to the rack is provided to allow the components to be replaced, inspected, maintained, or otherwise accessed. Chassis displacement is usually accomplished from the front of a rack by engaging the associated chassis and pulling the chassis forward. Rear displacement, however, has been performed in a variety of ways including engaging and pulling on the chassis's cabling or pulling on the chassis itself when accessible.

As anyone who has assembled a computer system or has seen the backside of a computer system can attest, access to the rear of a computer system is typically not obstacle free. Along with a myriad of cables plugging into the back of nearly all computer systems and peripherals, particularly rack mounted computer systems, the crowded nature of the rack contributes additional roadblocks to access and rearward displacement of rack mounted computer components.

SUMMARY

In accordance with the teachings of the present disclosure, a removable apparatus for providing displacement to a chassis on a slide rail coupled to a rack mounted computer system is provided. In one embodiment, an apparatus enabling displacement of a chassis coupled to a slide rail is provided. The apparatus includes an elongated member having respective first and second ends and respective first and second surfaces. A handle is preferably coupled proximate the first end of the elongated member. The apparatus may further include a releasable latch preferably coupled proximate the second end of the elongated member and configured to engage a releasable latch aperture in the slide rail. Additionally, at least one locking member is preferably coupled to the first surface of the elongated member and is operable to engage the slide rail.

In another embodiment, an apparatus enabling displacement of at least one component of a rack mounted computer system is provided, the component having a slide mounted chassis. The apparatus includes an elongated member with respective first and second surfaces and respective first and second ends. The apparatus further includes a handle preferably coupled proximate the first end of the elongated member and a plurality of 'T'-shaped locking members preferably coupled to the first surface of the elongated member. The 'T'-shaped locking members are preferably operable to engage notches in the slide rail. The apparatus may include a spring biased releasable latch having at least one grasping member preferably coupled proximate the second end of the second surface of the elongated member. The grasping member is preferably operable to engage a releasable latch aperture on the slide rail while the spring biased releasable latch is preferably operable to draw the grasping member towards the 'T'-shaped locking members.

In yet another embodiment, a computer system including a rack having respective left and right slide rails and respective front and back sides is provided. The slide rails have at least one locking member notch and at least one releasable latch aperture contained therein. A computer component having at least one processor, memory operably associated with the processor and a chassis housing the memory and the processor are also included with the computer system. The chassis is preferably coupled to the left and right slide rails. A displacement apparatus is included which is removably coupled to at least one slide rail and is constructed with an elongated member having respective first and second surfaces and respective first and second ends. A handle is preferably coupled proximate the first end of the elongated member and a releasable latch is coupled proximate the second end of the elongated member. The releasable latch is preferably operable to engage the releasable latch aperture on the slide rails. The displacement apparatus further includes at least one locking member coupled to the second surface of the elongated member which is configured to engage at least one locking member notch on the slide.

A technical advantage provided by the present disclosure lies in its ability to grant a user access to a 1U component of a computer system from the rear of a rack.

Another technical advantage provided by the present disclosure is the ability to draw a component out of a rack from the rear without pulling on the component's cabling.

BRIEF DESCRIPTION OF THE DRAWINGS

For a more complete understanding of the present disclosure, and the advantages thereof, reference is now made to the following written description taken in conjunction with the accompanying drawings, in which.

DETAILED DESCRIPTION

Preferred embodiments of the present disclosure and its advantages are best understood by referring to FIGS. 1–8 of the drawings, like numerals being used for like and corresponding parts of the various drawings.

Figure 1:
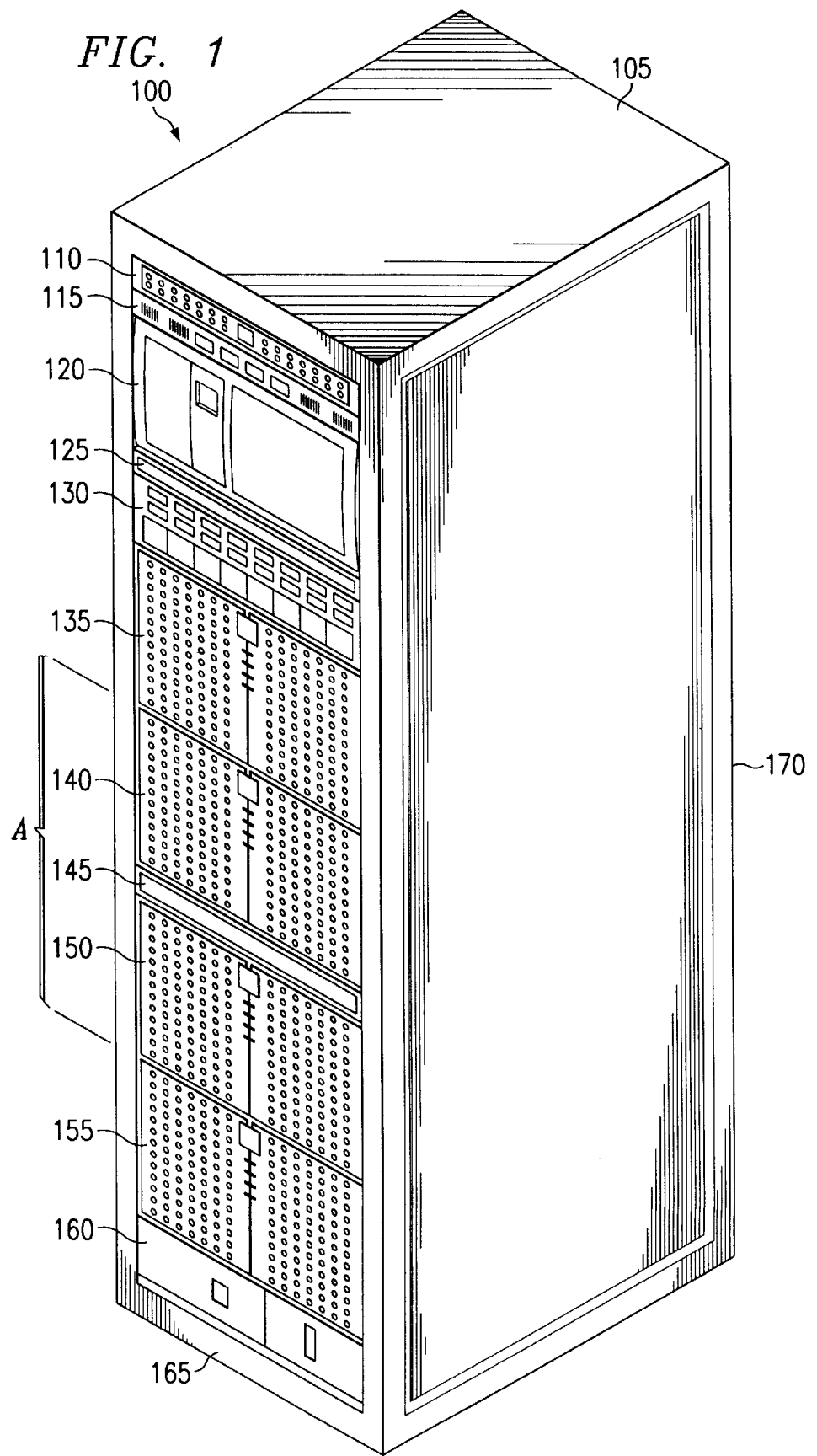
FIG. 1 is a schematic drawing showing a front view of a computer system incorporating teachings of the present disclosure.

Referring now to FIG. 1, a front view of a rack mounted computer system 100 incorporating teachings of the present disclosure is shown. Computer system 100 includes a component filled rack 105. For this particular embodiment, rack 105 has a component capacity of forty-two (42) "U." Included in rack 105 is bridge 110, switch 115, digital linear tape (DLT) 120, SPS 125, storage device 130, four servers 135, 140, 150 and 155, switch box 145 and uninterruptible power supply (UPS) 160. As illustrated, bridge 110, switch 115, SPS 125 and switchbox 145 each have 1U chassis. Servers 135, 140, 145 and 150 each have 7U chassis while UPS 160 and storage device 130 utilize 3U chassis. DLT 120 is contained in a 4U chassis. Each chassis is preferably mounted onto a respective pair of slide mechanisms (not expressly shown) which allows the chassis to be displaced with respect to either the front 165 or rear 170 of rack 105. As can be ascertained, many different chassis configurations are possible within rack 105.

Figure 2:
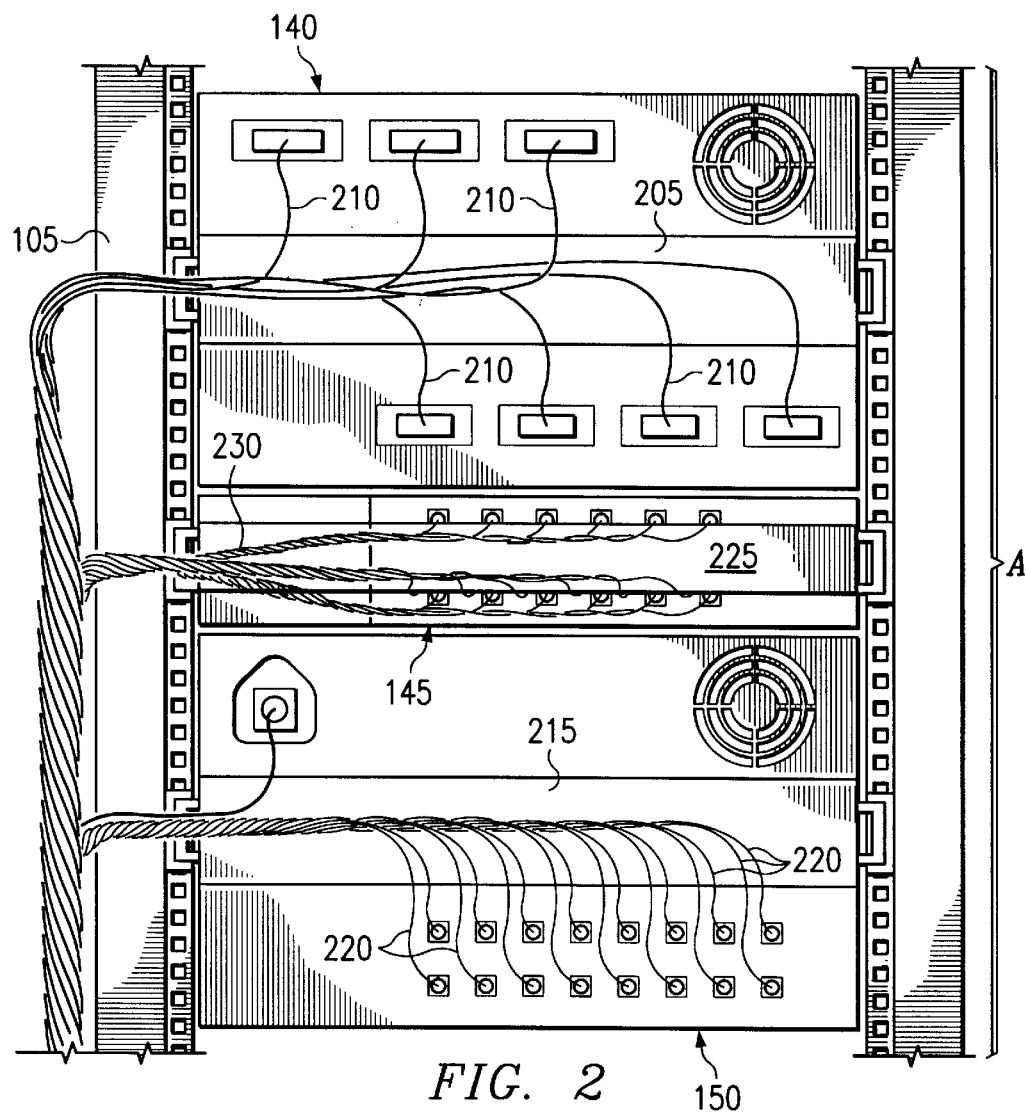
FIG. 2 is a schematic drawing in elevation with portions broken away of a rear view of a portion of the computer system depicted in FIG. 1.

Referring now to FIG. 2, a rear view of a portion of computer system 100 is shown. The portion of computer system 100 illustrated in FIG. 2 is taken along segment A—A of FIG. 1. FIG. 2 is indicative of the congestion of components, cabling and cable management present in computer system 100. As illustrated, server 140 has cable management arm 205 with cables 210 attached thereto. Similarly, server 150 includes cable management arm 215 and cabling 220 attached thereto. While servers 140 and 145 each have approximately 7U of height space with which to store cabling 210 and 220, switch box 145 has only 1U of height space to store cable management arm 225 and cabling 230. As illustrated, access to internal components, ports, etc., from the rear of rack 105 is possible when working with servers 140 and 150 or similarly sized components. However, virtually all access to the rear of 1U switch box 145 is prevented by the presence of cable management arm 225 and cabling 230.

Figure 3:
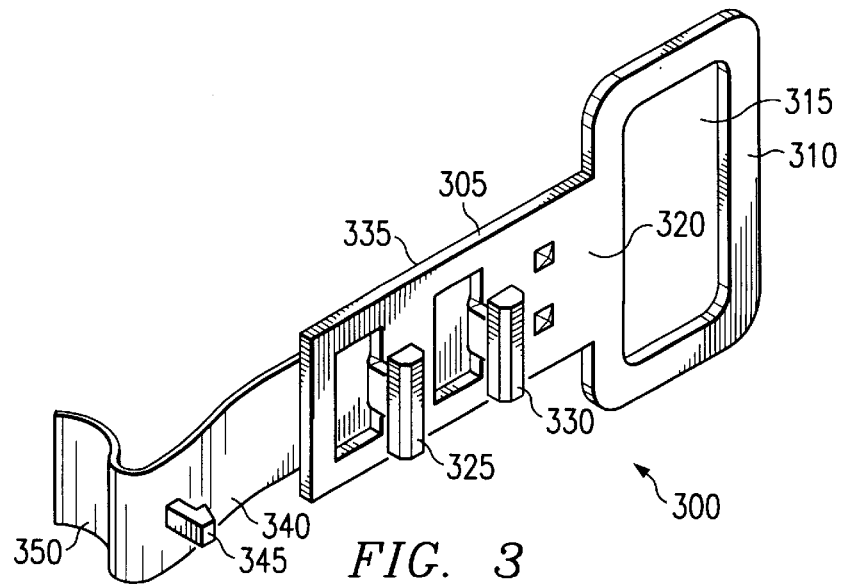
FIG. 3 illustrates a perspective view of a first surface of a displacement apparatus incorporating teachings of the present disclosure.

Referring now to FIG. 3, a perspective view of the first surface of a displacement apparatus incorporating teachings of the present disclosure is shown. Displacement apparatus 300 is configured to provide a user with access for displacement of a component in rack 105. Displacement apparatus 300 is constructed from elongated member 305 with handle 310 attached at one end. Handle 310 includes aperture 315 to allow a user to insert their fingers therethrough, enabling the user to grip handle 310. Preferably attached to first surface 320 of elongated member 305 are 'T'-shaped locking members 325 and 330. Preferably attached to second surface 335 of elongated member 305, opposite handle 310, is releasable latch 340. Releasable latch 340 is preferably made from spring-form steel and includes grasping member 345 and disengagement member 350.

Figure 4:
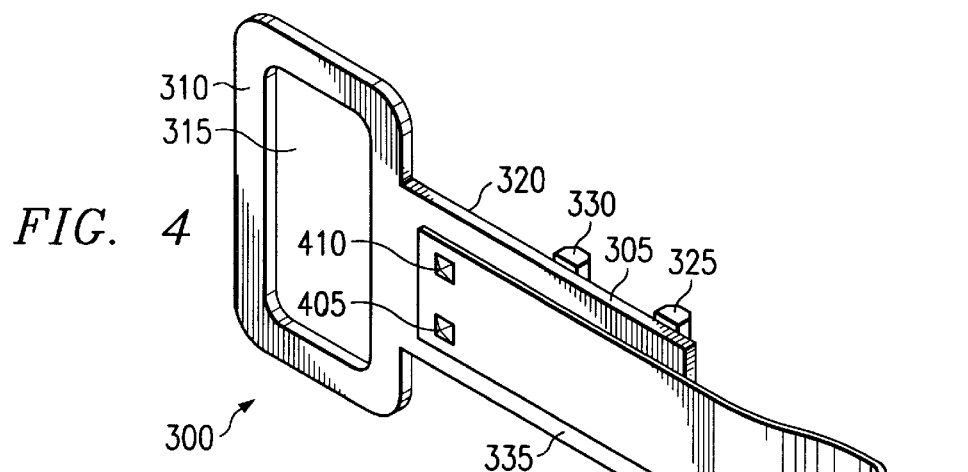
FIG. 4 illustrates a perspective view of a second surface of the displacement apparatus of FIG. 3.

Referring now to FIG. 4, a perspective view of the second surface of the displacement apparatus of FIG. 3 is depicted. FIG. 4 depicts the attachment of releasable latch 340 to second surface 335 of elongated member 305 via mechanical fasteners 405 and 410. As illustrated in this embodiment, releasable latch 340 is preferably made from a spring-form steel material and elongated member 305 is made from a rigid steel composite. Disengagement member 350 of releasable latch 340 is a thumb lever configured such that when depressed, hook shaped grasping member 345 is caused to move in a direction away from 'T'-shaped locking members 325 and 330. Further functionality of grasping member 345, 'T'-shaped locking members 325 and 330 as well as other components will be discussed in greater detail below.

Figure 5:
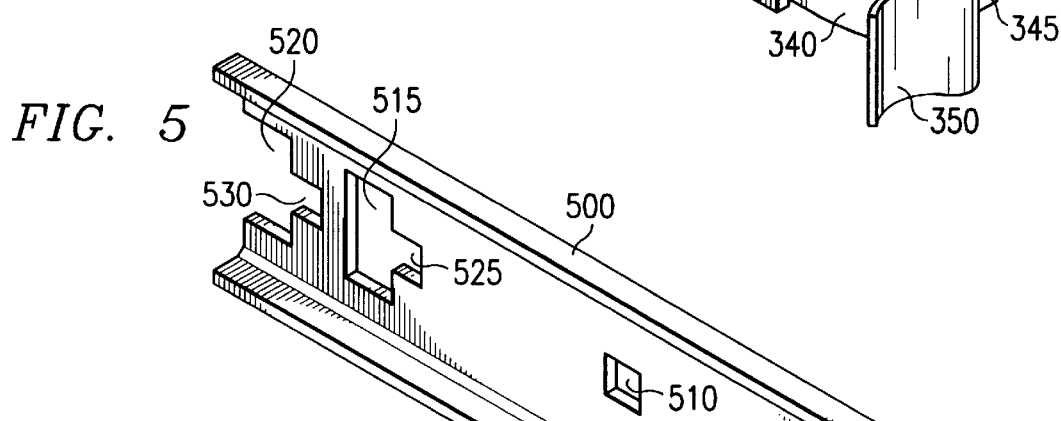
FIG. 5 is a schematic drawing in elevation with portions broken away showing a perspective view of a slide rail associated with the computer system of FIG. 1.

Referring now to FIG. 5, a perspective view of a portion of slide rail 500 is shown. Slide rail 500 is utilized with the slide mechanisms (not expressly shown) in rack 105 to enable the components contained therein to be displaced either to the front 165 or to the rear 170 of rack 105. Slide rails 500 are usually contained within a slide mechanism (not expressly shown) having one or more series of bearings allowing the slide rails 500 to easily move. A pair of slide rails 500 are typically attached to both sides of each component in rack 105. A series of apertures, similar to aperture 505, are included on each slide rail 500 to enable component attachment.

A series of apertures and notches are preferably included on at least one end of slide rail 500. Releasable latch aperture 510 is included on slide rail 500 to enable grasping member 345 of releasable latch 340 to be releasably coupled to slide rail 500. Similarly, aperture 515 and notch 520 are included on slide rail 500 to enable 'T'-shaped locking members 325 and 330 to be releasably coupled to slide rail 500. Notches 525 and 530 enable 'T'-shaped locking members 325 and 330 respectively to be held in place during operation.

Displacement apparatus 300 is engaged with slide rail 500 by placing 'T'-shaped locking member 325 in notch 520 and 'T'-shaped locking member 325 into aperture 515. Once 'T'-shaped locking members 325 and 330 have been inserted into notch 520 and aperture 515 respectively, displacement apparatus 300 is directed towards aperture 505 such that the posts (not expressly shown) of 'T'-shaped locking members 325 and 330 engage notches 525 and 530 respectively. Once the posts of 'T'-shaped locking members 325 and 330 engage notches 525 and 530 respectively, spring-form steel releasable latch 340 is manipulated in such a way that grasping member 345 is inserted into releasable latch aperture 510. Upon insertion of grasping member 345 into releasable latch aperture 510, the spring biased nature of releasable latch 340 causes displacement apparatus 300 to be held in place by applying tension which causes grasping member 345 to draw towards 'T'-shaped locking members 325 and 330. This tension causes 'T'-shaped locking members 325 and 330 to maintain their engagement with notches 525 and 530 respectively as well as maintains grasping member 345 fixed in releasable latch aperture 510.

Figure 6:
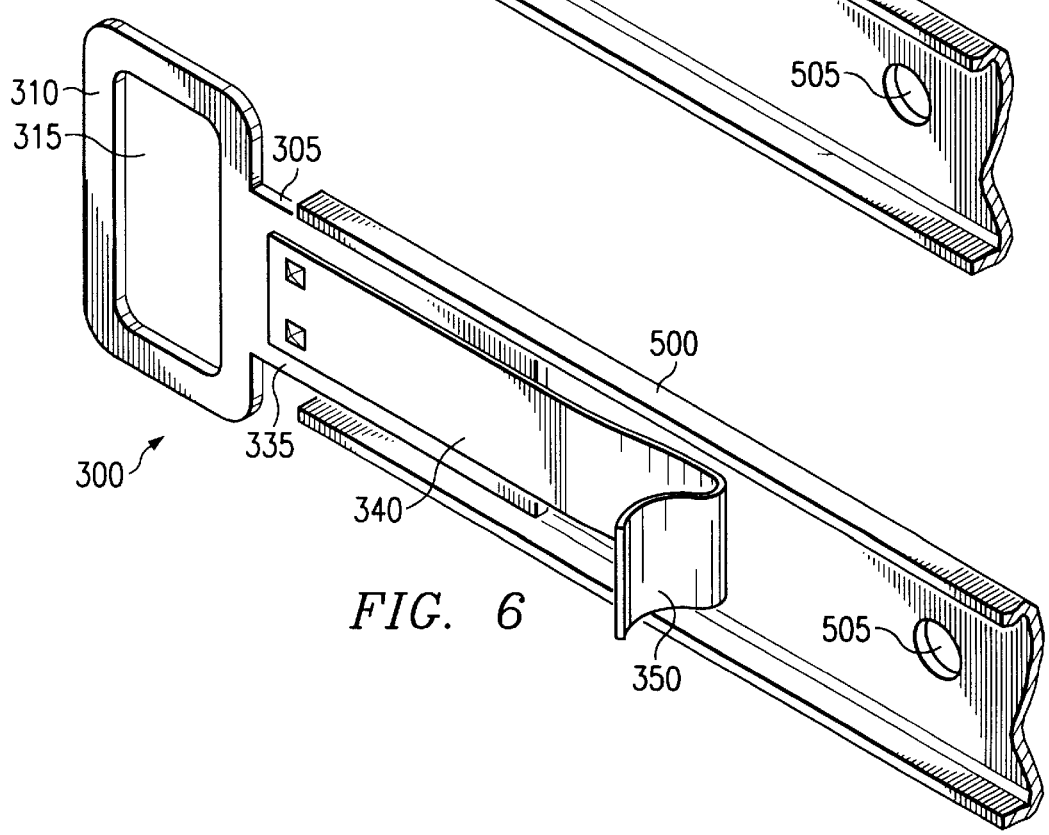
FIG. 6 is a schematic drawing showing the slide rail of FIG. 5 coupled with the displacement apparatus of FIGS. 3 and 4.

Referring now to FIG. 6, displacement apparatus 300 is shown releasably coupled with slide rail 500. FIG. 6 illustrates displacement apparatus 300 in its operating position. A user wishing to displace or move a component such as 1U switch 115 or 1U bridge 110 attached to a respective pair of slide rails 500 in a pair of slide mechanisms (not expressly shown) can place one or more fingers through aperture 315 and pull displacement apparatus 300 towards them.

Displacement apparatus 300 is removed from slide rail 500 with the use of disengagement member 350. By pressing disengagement member 350 towards slide rail 500, grasping member 345 is caused to release from releasable latch aperture 510. Once grasping member 345 is released from releasable latch aperture 510, 'T'-shaped locking members 325 and 330 can be removed from notches 525 and 530 respectively. As a result, displacement apparatus 300 is disengaged from slide rail 500 for use on a slide rail 500 on an opposite side of the component being displaced or on a component elsewhere in rack 105.

Figure 7:
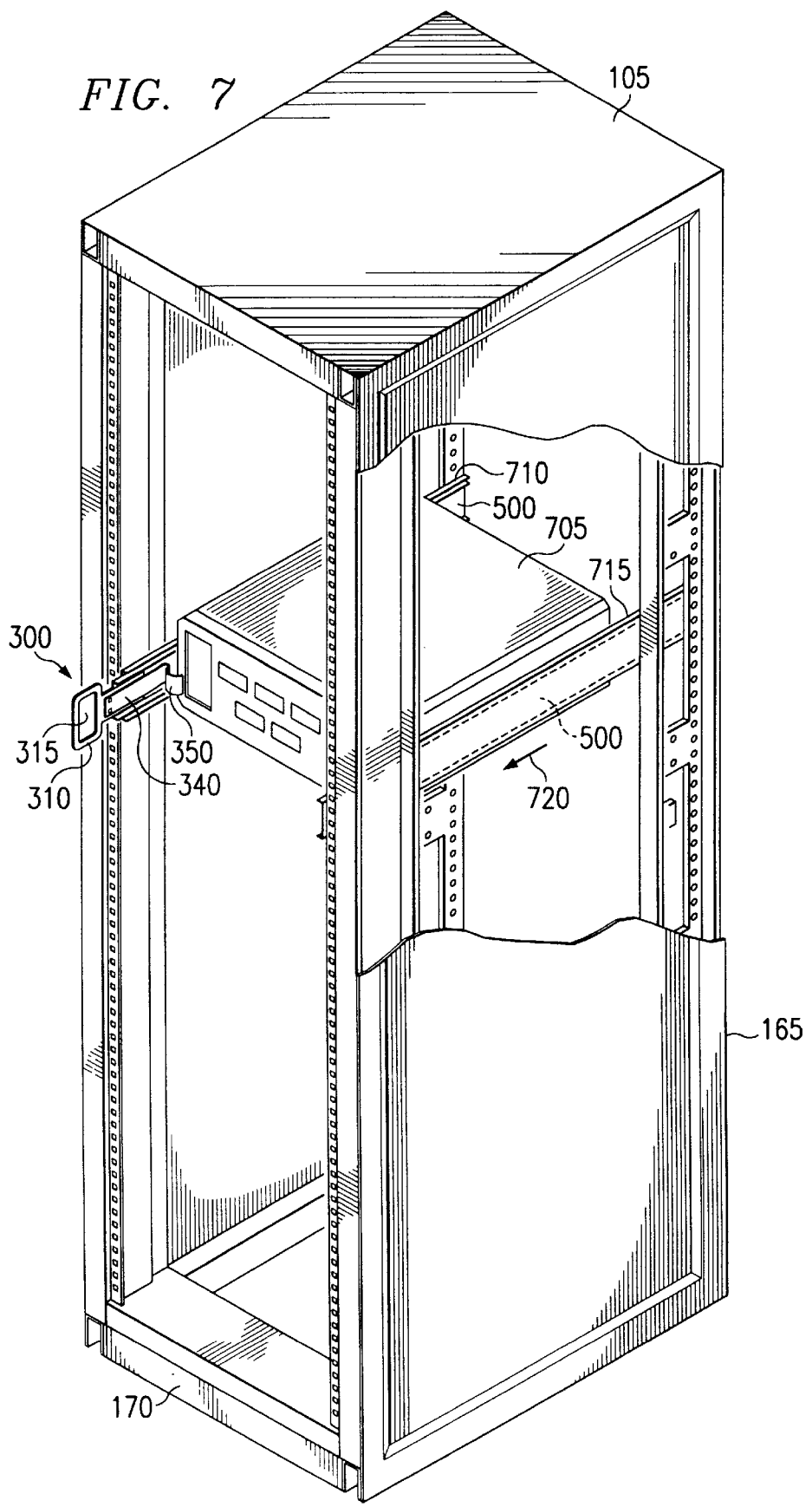
FIG. 7 is a schematic drawing in section and in elevation with portions broken away showing an isometric view of the rack mounted computer system of FIG. 1.

Referring now to FIG. 7, a cut-away view of a rack mounted computer system incorporating teachings of the present disclosure is shown. Illustrated in FIG. 7 is a cut-away view of rack 105 having 1U component 705 attached to slide mechanisms 710 and 715, where slide mechanism 710 and 715 each have a slide rail 500 contained therein. Coupled to one slide rail 500 is displacement apparatus 300. Displacement apparatus 300 has been coupled to slide rail 500 in the manner described above. By placing one or more fingers into aperture 315 and pulling on handle 310, component 705 can be displaced as indicated at arrow 720.

Figure 8:
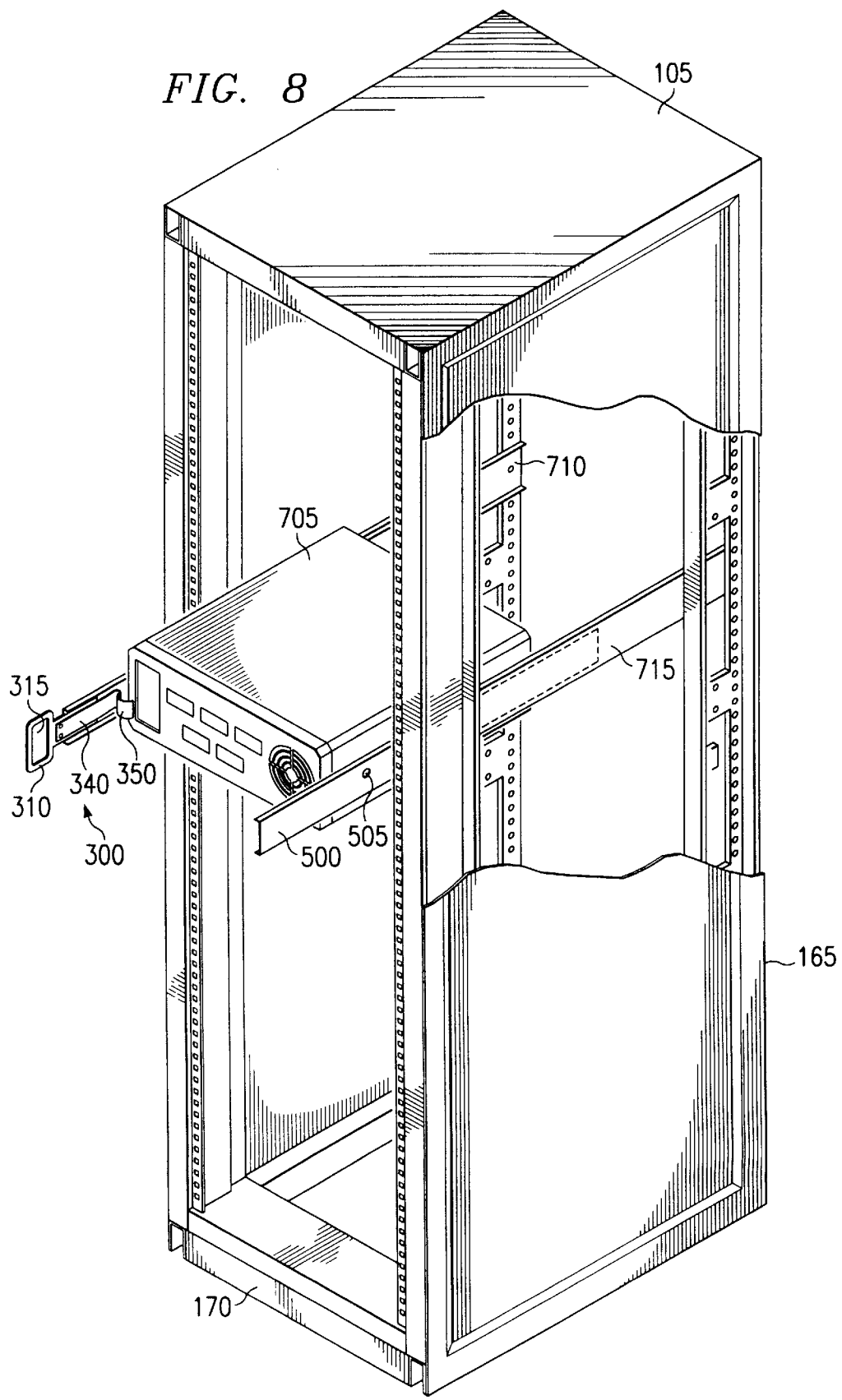
FIG. 8 is a schematic drawing in section and in elevation with portions broken away showing an isometric view with one component displaced from the rear of the rack mounted computer system of FIG. 1.

Referring now to FIG. 8, a displaced component in a rack is shown. FIG. 8 illustrates the result of employing displacement apparatus 300 as described above. Component 705 has been displaced with respect to the rear 170 of rack 105. The actual amount of displacement is variable and can be determined according to a particular rack 105 or component 705 design.

Although the present disclosure and its advantages have been described in detail, it should be understood that various changes, substitutions, and alterations can be made hereto without departing from the spirit and scope of the invention as defined by the following claims.

What is claimed is:

1. An apparatus enabling displacement of a slide mounted chassis comprising:
   an elongated member having respective first and second ends and respective first and second surfaces;
   a handle preferably coupled proximate the first end of the elongated member;
   a releasable latch preferably coupled proximate the second end of the elongated member operable to engage a releasable latch aperture in the slide; and
   at least one locking member preferably coupled to the first surface of the elongated member and operable to engage the slide.

2. The apparatus of claim 1 further comprising a 'T'-shaped locking member.

3. The apparatus of claim 1 further comprising a grasping member preferably coupled proximate a distal end of the releasable latch.

4. The apparatus as claimed in claim 1 further comprising a disengagement mechanism preferably coupled proximate a distal end of the releasable latch.

5. The apparatus of claim 1 wherein the releasable latch comprises spring form steel.

6. The apparatus of claim 1 wherein the handle comprises an aperture through the respective first and second surfaces of the elongated member.

7. An apparatus enabling displacement of at least one component of a rack mounted computer system comprising:
   the at least one component having a slide mounted chassis;
   an elongated member having respective first and second surfaces and respective first and second ends;
   a handle preferably coupled proximate the first end of the elongated member;
   a plurality of 'T'-shaped locking members preferably coupled to the first surface of the elongated member preferably operable to engage notches in the slide;
   a spring biased releasable latch having at least one grasping member preferably coupled proximate the second end of the second surface of the elongated member;
   the grasping member operable to engage a releasable latch aperture on the slide; and
   the spring biased releasable latch operable to draw the grasping member towards the 'T'-shaped locking members.

8. The apparatus of claim 7 further comprising a disengagement member preferably coupled to the spring biased releasable latch operable to disengage the grasping member from the releasable latch aperture.

9. The apparatus of claim 7 wherein the spring biased releasable latch comprises spring form steel.

10. A computer system comprising:
    a rack having respective left and right slide mechanisms and respective front and back sides;
    the slide mechanisms having at least one locking member notch and at least one releasable latch aperture;
    a computer having at least one processor;
    memory operably associated with the at least one processor; and
    a chassis housing the memory and the processor; the chassis preferably coupled to the left and right slide mechanisms;
    a displacement apparatus removably coupled to at least one slide mechanism having an elongated member having respective first and second surfaces and respective first and second ends;
    a handle preferably coupled proximate the first end of the elongated member;
    a releasable latch preferably coupled proximate the second end of the elongated member operable to engage the releasable latch aperture; and
    at least one locking member preferably coupled to the second surface of the elongated member configured to engage the at least one locking member notch.

11. The computer system of claim 10 wherein the handle comprises an aperture through the first and second surfaces of the elongated member.

12. The computer system of claim 10 further comprising chassis having heights ranging from 1U to 4U and larger.

13. The computer system of claim 10 wherein the releasable latch comprises spring form steel.

14. The computer system of claim 10 further comprising a grasping member preferably coupled to a first surface proximate a distal end of the releasable latch.

15. The computer system of claim 10 further comprising a disengagement member preferably coupled to a second surface of the releasable latch.

16. The computer system of claim 10 wherein the chassis is approximately 1U in height.

17. The computer system of claim 10 wherein the displacement apparatus is operable to enable displacement of the chassis in either slide mechanism.

* * * * *